United States Patent

Nogami

(10) Patent No.: US 10,120,394 B2
(45) Date of Patent: Nov. 6, 2018

(54) PROCESSING LIQUID SUPPLY DEVICE, PROCESSING LIQUID SUPPLY METHOD, AND STORAGE MEDIUM

(71) Applicant: Tokyo Electron Limited, Tokyo (JP)

(72) Inventor: Tsuyoshi Nogami, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 297 days.

(21) Appl. No.: 15/046,627

(22) Filed: Feb. 18, 2016

(65) Prior Publication Data

US 2016/0246307 A1    Aug. 25, 2016

(30) Foreign Application Priority Data

Feb. 19, 2015   (JP) ................... 2015-030713

(51) Int. Cl.
  *G05D 7/06*   (2006.01)
  *G05B 19/04*  (2006.01)
  *H01L 21/67*  (2006.01)

(52) U.S. Cl.
  CPC ..... *G05D 7/0635* (2013.01); *H01L 21/67017* (2013.01); *H01L 21/67051* (2013.01)

(58) Field of Classification Search
  CPC ................. G03F 7/162; H01L 21/6715; H01L 21/67017
  See application file for complete search history.

(56) References Cited

U.S. PATENT DOCUMENTS

2011/0277793 A1* 11/2011 Inada .............. H01L 21/67051
                                                134/18
2012/0181239 A1*  7/2012 Furusho .............. G03F 7/162
                                                210/808
2018/0015501 A1*  1/2018 De Vries ................ B05D 1/26

FOREIGN PATENT DOCUMENTS

JP         2010-123709 A     6/2010

* cited by examiner

*Primary Examiner* — Changhyun Yi
(74) *Attorney, Agent, or Firm* — Pearne & Gordon LLP

(57) ABSTRACT

An operation amount for operating a flow rate control mechanism of a processing liquid can be appropriately adjusted based on a physical property of the processing liquid or a characteristic of a processing liquid supply mechanism while supplying the processing liquid. In a processing liquid supply device that supplies a processing liquid to a substrate, a processing liquid supply mechanism discharges the processing liquid toward the substrate via a flow rate control mechanism which controls the processing liquid based on an operation amount. A flow rate detection unit detects a flow rate of the processing liquid supplied to the substrate. A system identification unit determines a system parameter according to a system model of the processing liquid supply mechanism. A flow rate controller determines a new operation amount of the flow rate control mechanism by using the system parameter.

9 Claims, 7 Drawing Sheets

PROCESSING LIQUID SUPPLY DEVICE, PROCESSING LIQUID SUPPLY METHOD, AND STORAGE MEDIUM

CROSS-REFERENCE TO RELATED APPLICATION

This application claims the benefit of Japanese Patent Application No. 2015-030713 filed on Feb. 19, 2015, the entire disclosures of which are incorporated herein by reference.

TECHNICAL FIELD

The embodiments described herein pertain generally to a technique of supplying a processing liquid to a substrate on which a process is performed.

BACKGROUND

There is known a liquid treatment process in which a substrate such as a semiconductor wafer (hereinafter, simply referred to as "wafer") is horizontally placed and the wafer is processed by supplying different kinds of processing liquids to the wafer in turn while rotating the wafer around a vertical axis.

The liquid treatment process is performed by a processing unit including a substrate holder configured to hold a substrate and a processing liquid supply mechanism configured to supply a processing liquid. Further, there is known a substrate processing system which is equipped with multiple processing units and a substrate transfer device configured to transfer wafers between the processing units and a carrier accommodating a multiple number of wafers therein.

In each of the aforementioned processing units, a multiple number of processing liquid supply mechanisms are provided to supply different kinds of processing liquids in turn. Furthermore, since the multiple processing units are provided in this substrate processing system, the substrate processing system is provided with a large number of processing liquid supply mechanisms.

Each processing liquid supply mechanism is equipped with a flow rate control mechanism such as a flow rate control valve configured to control a flow rate of the processing liquid. In order to adjust a supply amount of the processing liquid from each processing liquid supply mechanism, an appropriate opening degree of a valve body needs to be set based on characteristics of the processing liquid supply mechanism, such as a supply pressure or a viscosity of the processing liquid, a flow rate characteristic of the flow rate control valve, a pressure loss between an upstream side and a downstream side thereof, etc.

By way of example, in order to allow the flow rate of the processing liquid to approach a target supply amount by automatic control with high accuracy, a control parameter needs to be adjusted based on, e.g., a relationship between the opening degree (operation amount) of the valve body and the flow rate of the processing liquid. Accordingly, in the processing unit configured to supply the plural kinds of processing liquids, control parameter of the processing liquid supply mechanisms need to be adjusted for respective processing liquids having a great difference in physical property such as density or viscosity individually. Furthermore, since an optimum value of the control parameter may be changed according to the range of a supply flow rate of the processing liquid, the control parameter may also be adjusted when a processing recipe for the wafer is changed.

In addition, since the optimum value of the control parameter also relies on a characteristic of the processing liquid supply mechanism, the control parameter needs to be adjusted differently for the individual processing units even when the same kind of processing liquid and the same processing recipe are used. Thus, in the overall substrate processing system including the plural processing units, the number of processes required for adjusting the control parameter is too many.

Described in Patent Document 1 is a technique of recording a flow rate of a processing liquid that flows through a processing liquid supply line in a substrate processing apparatus configured to vary a supply flow rate of the processing liquid based on an opening degree of a needle value. According to this document, if a processing condition or the supply flow rate of the processing liquid is set, the opening degree of the needle value is adjusted in advance based on this setting result, so that the appropriate flow rate of the processing liquid is set from the beginning of the supply of the processing liquid.

In the technique disclosed in Patent Document 1, however, a relationship between a position of the needle valve and the supply flow rate needs to be investigated in advance for every single set flow rate. Accordingly, whenever a processing recipe or the like is changed, an operation for investigating this relationship is additionally required.

Patent Document 1: Japanese Patent Laid-open Publication No. 2010-123709 (Claims 2 to 4, and paragraphs [0015] to [0021])

SUMMARY

In view of the foregoing, exemplary embodiments provide a technique of appropriately adjusting an operation amount for operating a flow rate control mechanism of a processing liquid based on a physical property of the processing liquid or a characteristic of a processing liquid supply mechanism, while supplying the processing liquid.

In one exemplary embodiment, a processing liquid supply device of supplying a processing liquid to a target substrate held on a substrate holder includes a processing liquid supply mechanism including a flow rate control mechanism configured to be controlled based on an operation amount to adjust a flow rate of the processing liquid supplied from a processing liquid source, which stores the processing liquid therein, and a supply nozzle configured to discharge the processing liquid whose flow rate is adjusted by the flow rate control mechanism toward the substrate held on the substrate holder; a flow rate detection unit configured to detect the flow rate of the processing liquid supplied to the supply nozzle; a system identification unit configured to determine a system parameter based on a sum of product values obtained by multiplying the system parameter to each of a time-series sample value of the operation amount and a time-series sample value of the flow rate detected by the flow rate detection unit, in order to identify a system model for acquiring an estimated flow rate of the processing liquid discharged from the supply nozzle; and a flow rate controller configured to determine a new operation amount by using the system parameter determined by the system identification unit and output the determined operation amount to the flow rate control mechanism.

The processing liquid supply device may be configured as follows.

(a) The flow rate controller determines the operation amount based on a target flow rate of the processing liquid discharged from the supply nozzle and the system parameter determined by the system identification unit. Here, a next substrate is held on the substrate holder in turn, and when starting a supply of the processing liquid to the next substrate that is held on the substrate holder and replaced with the substrate, the flow rate controller determines the operation amount based on the system parameter determined when stopping the supply of the processing liquid to the substrate.

(b) The flow rate controller determines the operation amount by a PID control based on a difference value between a target flow rate of the processing liquid discharged from the supply nozzle and the flow rate of the processing liquid detected by the flow rate detection unit, and determines a control parameter of the PID control by using the system parameter determined by the system identification unit. Here, if the flow rate of the processing liquid detected by the flow rate detection unit is varied beyond a preset variation range, the flow rate controller calculates the difference value based on the estimated flow rate, instead of the flow rate, obtained by using the system parameter determined before the variation is detected, and determines the operation amount based on the difference value.

(c) The flow rate control mechanism is a flow rate control valve configured to increase or decrease the flow rate of the processing liquid according to an opening degree of a valve body.

According to the exemplary embodiments, the influence of the physical property of the processing liquid or the characteristic of the processing liquid supply mechanism is investigated through the system model, and the operation amount is determined based on the investigation result. Therefore, even in case that the physical property of the processing liquid or the characteristic of the processing liquid supply mechanism is changed, it is possible to adjust the flow rate of the processing liquid appropriately while supplying the processing liquid.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
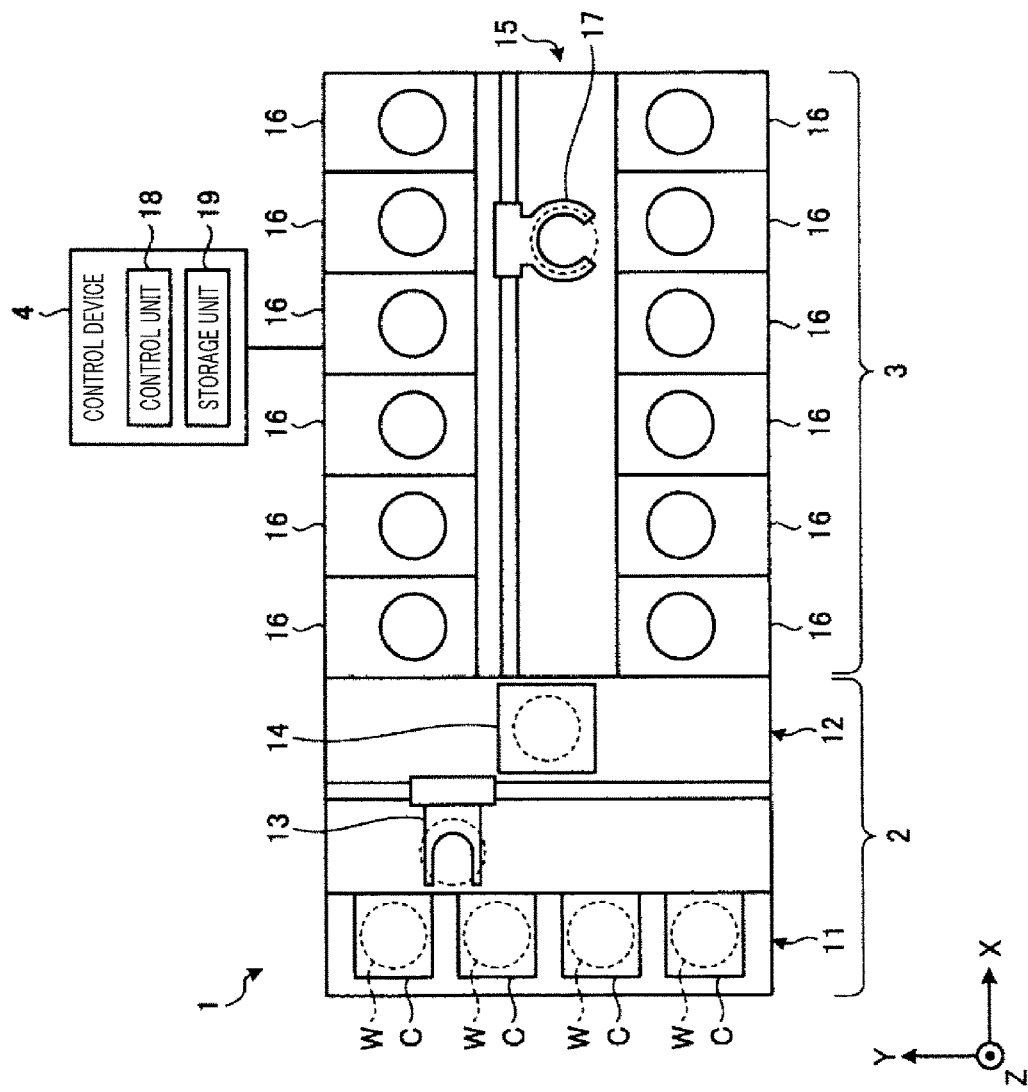
FIG. 1 is a plan view illustrating an outline of a substrate processing system according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

FIG. 1 is a plan view illustrating an outline of a substrate processing system provided with a processing unit according to an exemplary embodiment of the present disclosure. In the following, in order to clarify positional relationships, the X-axis, Y-axis and Z-axis which are orthogonal to each other will be defined. The positive Z-axis direction will be regarded as a vertically upward direction.

As illustrated in FIG. 1, a substrate processing system 1 includes a carry-in/out station 2 and a processing station 3. The carry-in/out station 2 and the processing station 3 are provided adjacent to each other.

The carry-in/out station 2 is provided with a carrier placing portion 11 and a transfer portion 12. In the carrier placing portion 11, a plurality of carriers C is placed to accommodate a plurality of substrates (semiconductor wafers in the present exemplary embodiment) (hereinafter, referred to as "wafers W") horizontally.

The transfer portion 12 is provided adjacent to the carrier placing portion 11, and provided with a substrate transfer device 13 and a delivery unit 14. The substrate transfer device 13 is provided with a wafer holding mechanism configured to hold the wafer W. Further, the substrate transfer device 13 is movable horizontally and vertically and pivotable around a vertical axis, and transfers the wafers W between the carriers C and the delivery unit 14 by using the wafer holding mechanism.

The processing station 3 is provided adjacent to the transfer portion 12. The processing station 3 is provided with a transfer portion 15 and a plurality of processing units 16. The plurality of processing units 16 is arranged at both sides of the transfer portion 15.

The transfer portion 15 is provided with a substrate transfer device 17 therein. The substrate transfer device 17 is provided with a wafer holding mechanism configured to hold the wafer W. Further, the substrate transfer device 17 is movable horizontally and vertically and pivotable around a vertical axis. The substrate transfer device 17 transfers the wafers W between the delivery unit 14 and the processing units 16 by using the wafer holding mechanism.

The processing units 16 perform a predetermined substrate processing on the wafers W transferred by the substrate transfer device 17.

Further, the liquid processing system 1 is provided with a control device 4. The control device 4 is, for example, a computer, and includes a control unit 18 and a storage unit 19. The storage unit 19 stores a program that controls various processings performed in the liquid processing system 1. The control unit 18 controls the operations of the liquid processing system 1 by reading and executing the program stored in the storage unit 19.

Further, the program may be recorded in a computer-readable recording medium, and installed from the recording medium to the storage unit 19 of the control device 4. The computer-readable recording medium may be, for example, a hard disc (HD), a flexible disc (FD), a compact disc (CD), a magnet optical disc (MO), or a memory card.

In the substrate processing system 1 configured as described above, the substrate transfer device 13 of the carry-in/out station 2 first takes out a wafer W from a carrier C placed in the carrier placing portion 11, and then places the taken wafer W on the transfer unit 14. The wafer W placed on the transfer unit 14 is taken out from the transfer unit 14 by the substrate transfer device 17 of the processing station 3 and carried into a processing unit 16.

The wafer W carried into the processing unit 16 is processed by the processing unit 16, and then, carried out from the processing unit 16 and placed on the delivery unit 14 by the substrate transfer device 17. After the processing of placing the wafer W on the delivery unit 14, the wafer W returns to the carrier C of the carrier placing portion 11 by the substrate transfer device 13.

Figure 2:
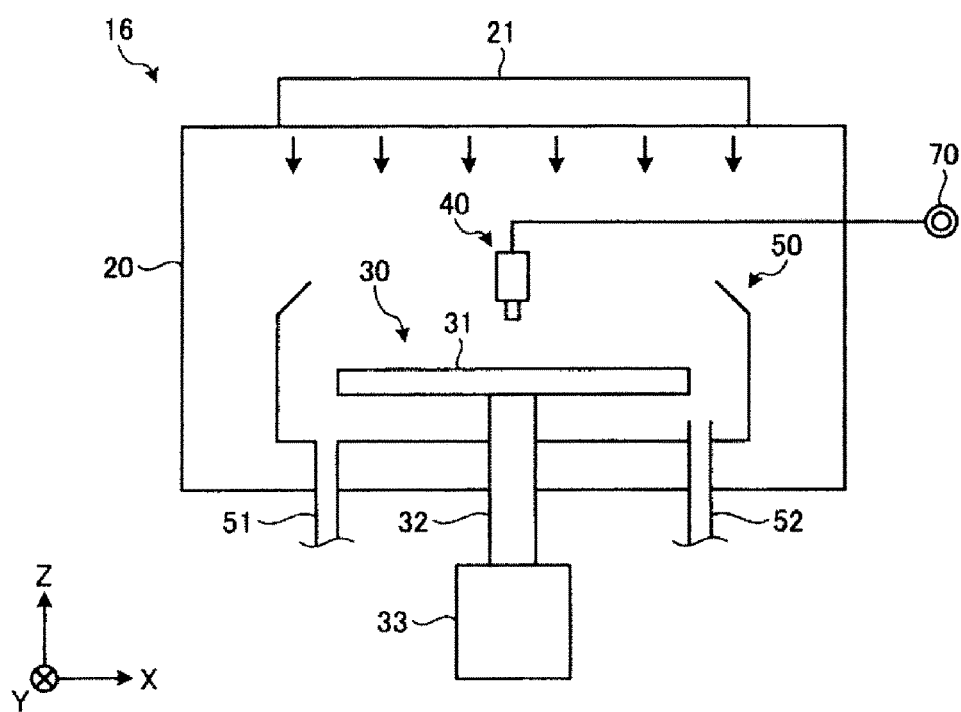
FIG. 2 is a longitudinal cross sectional view illustrating an outline of a processing unit.

As illustrated in FIG. 2, the processing unit 16 is provided with a chamber 20, a substrate holding mechanism 30, a processing fluid supply unit 40, and a recovery cup 50.

The chamber 20 accommodates the substrate holding mechanism 30, the processing fluid supply unit 40, and the recovery cup 50. A fan filter unit (FFU) 21 is provided on the ceiling of the chamber 20. The FFU 21 forms a downflow in the chamber 20.

The substrate holding mechanism 30 is provided with a holding unit 31, a support unit 32, and a driving unit 33. The holding unit 31 holds the wafer W horizontally. The support unit 32 is a vertically extending member, and has a base end portion supported rotatably by the driving unit 33 and a tip end portion supporting the holding unit 31 horizontally. The driving unit 33 rotates the support unit 32 around the vertical axis. The substrate holding mechanism 30 rotates the support unit 32 by using the driving unit 33, so that the holding unit 31 supported by the support unit 32 is rotated, and hence, the wafer W held in the holding unit 31 is rotated.

The processing fluid supply unit 40 supplies a processing fluid onto the wafer W. The processing fluid supply unit 40 is connected to a processing fluid source 70.

The recovery cup 50 is disposed to surround the holding unit 31, and collects the processing liquid scattered from the wafer W by the rotation of the holding unit 31. A drain port 51 is formed on the bottom of the recovery cup 50, and the processing liquid collected by the recovery cup 50 is discharged from the drain port 51 to the outside of the processing unit 16. Further, an exhaust port 52 is formed on the bottom of the recovery cup 50 to discharge a gas supplied from the FFU 21 to the outside.

In the present exemplary embodiment, the processing fluid supply unit 40 of each processing unit 16 serves as a processing liquid supply device configured to supply a processing liquid as a processing fluid to the wafer W held on the substrate holding mechanism (substrate holder) 30. This processing liquid supply device has functions of: detecting influences of the kind of the processing liquid, a supply condition of the processing liquid and a device characteristic upon adjustment of a flow rate of the processing liquid; and adjusting the flow rate of the processing liquid based on the detection result, while supplying the processing liquid. Hereinafter, a configuration of the processing liquid supply device will be explained with reference to FIG. 3.

Figure 3:
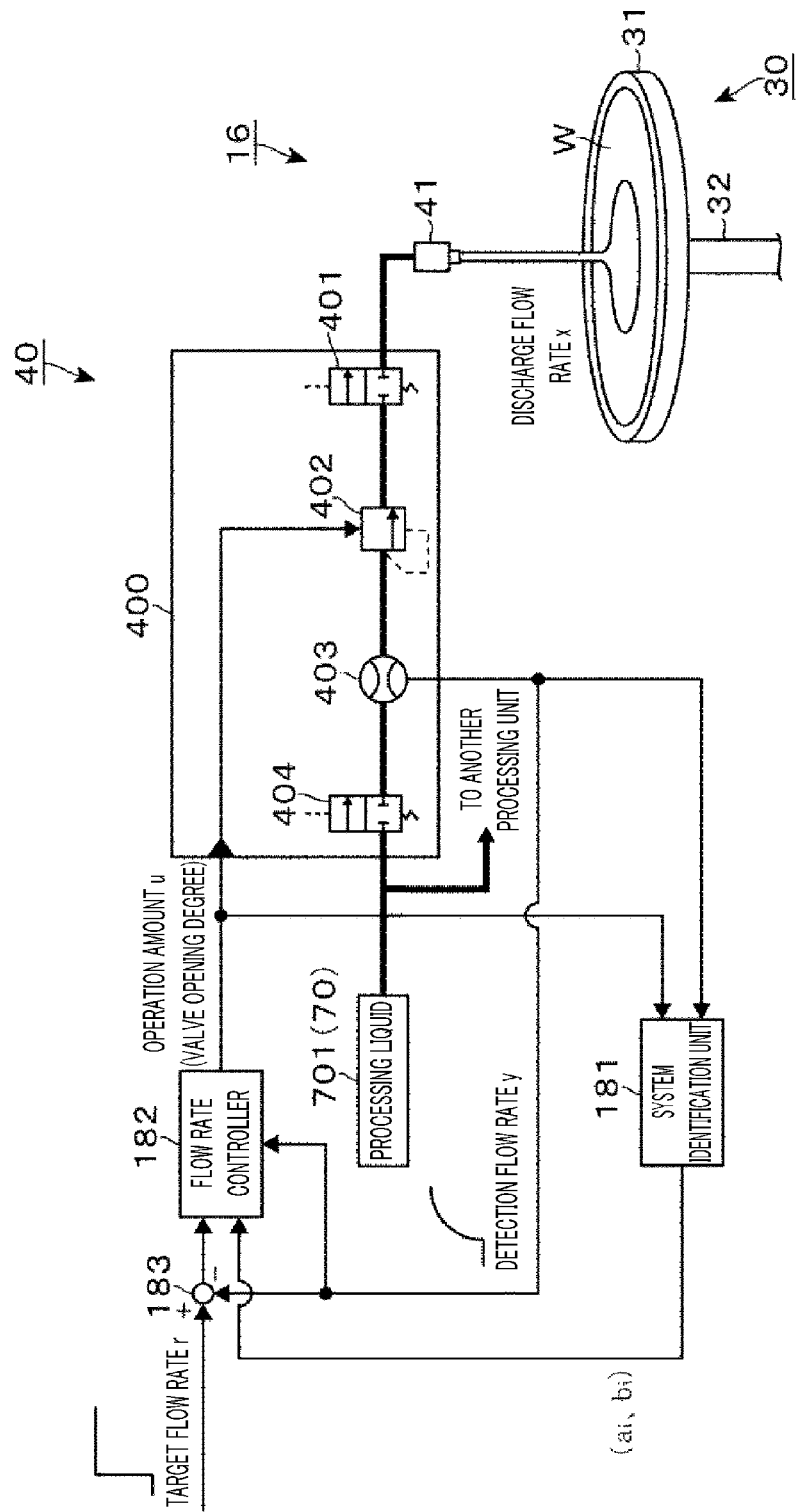
FIG. 3 is a block diagram illustrating a processing liquid supply mechanism provided in the processing unit and a control mechanism therefor.

As depicted in FIG. 3, the processing fluid supply unit 40 of each processing unit 16 includes a supply nozzle 41 configured to discharge the processing liquid to the wafer W held on the substrate holding mechanism 30; and a processing liquid supply unit 400 which is connected to the supply nozzle 41 and is configured to supply or stop the supply of the processing liquid as well as to adjust the flow rate thereof. The supply nozzle 41 and the processing liquid supply unit 400 constitute a processing liquid supply mechanism of the present exemplary embodiment. In each processing unit 16, the processing liquid supply mechanisms corresponding to respective different kinds of processing liquids are provided.

By way of example, in the processing liquid supply unit 400, an opening/closing valve 401 configured to supply and stop the supply of the processing liquid into the supply nozzle 41; a flow rate control valve 402 configured to adjust the flow rate of the processing liquid; a flowmeter 403 as a flow rate detector configured to detect the flow rate of the processing liquid supplied into the supply nozzle 41; and an opening/closing valve 404 configured to supply and stop the supply of the processing liquid into the flowmeter 403 are provided in this sequence from the downstream side. Further, the opening/closing valve 404 is also connected to a processing liquid source 701 (corresponding to the processing fluid source 70 shown in FIG. 2) commonly shared by the processing units 16.

The flow rate control valve 402 provided in the processing liquid supply unit 400 corresponds to a flow rate control mechanism of the present exemplary embodiment, and is provided with a non-illustrated valve body. The valve body is opened or closed in between a completely closed state (opening degree of 0%) and a completely opened state (opening degree of 100%) based on a signal indicating a valve opening degree (operation amount) inputted from the outside.

Here, assume that the above-described processing liquid supply mechanism (processing liquid supply unit 400 and supply nozzle 41) is configured as a linear system. Here, u(t) denotes an operation amount inputted to this system; x(t), a flow rate of the processing liquid discharged from the supply nozzle 41; and y(t), a flow rate of the processing liquid detected by the flowmeter 403.

In this case, a current flow rate x(t) can be calculated from the following equations (1) and (2) by using time-series sample values u(t−i) of the operation amount and time-series sample values x(t−i) of the flow rate of the processing liquid discharged from the supply nozzle 41 up to a past time i (i=1 n).

[Expression 1]

$$x(t) = -\sum_{i=0}^{n} a_i \cdot x(t-i) + \sum_{i=0}^{n} b_i \cdot u(t-i) \quad (1)$$

-continued

[Expression 2]

$$y(t) = x(t) + v(t) \qquad (2)$$

Here, $a_i$ and $b_i$ denotes system parameters of a system model represented by the above equations (1) and (2), and v(t) denotes a discrete statistical noise of which mean value is zero.

When a variation width of the noise v is sufficiently small, the detection flow rate y of the processing liquid detected by the flowmeter 403 can be used instead of the flow rate x of the processing liquid discharged from the supply nozzle 41. Accordingly, the system model of the equation (1) can be represented by a sum of product values which are obtained by multiplying each of the system parameters $a_i$ and $b_i$ to the time-series sample values u(t–i) of the operation amount and to the time-series sample values y(t–i) of the detection flow rate.

In other words, if it is possible to obtain the system parameters $a_i$ and $b_i$, the supply flow rate x of the processing liquid can be estimated based on the state of the processing liquid supply mechanism, the kind of the processing liquid, the supply condition thereof, etc., from the current time up to the past time i by using the time-series sample values y(t–i) of the detection flow rate and the time-series sample values u(t–i) of the operation amount.

For the purpose, as illustrated in FIG. 3, the processing liquid supply device according to the exemplary embodiment is equipped with a system identification unit 181. The system identification unit 181 is configured to detect the operation amount u (opening degree of the valve body) inputted to the flow rate control valve 402 and the detection flow rate y detected by the flowmeter 403 and configured to determine the system parameter of the system model represented by the equation (1).

Here, the determining of the system parameter in the system model indicated by the equation (1) by using the time-series sample values of the input signal (in the present exemplary embodiment, the operation amount (opening degree) of the flow rate control valve 402) and the output signal x (in the present exemplary embodiment, the detection flow rate y of the flowmeter 403) is referred to as "system identification," and a method therefor is generally known in the art.

As an example of an algorithm for determining the system parameter, a method of least squares or an auxiliary variable method may be used (see, for example, "Basics of system identification" by Shuichi Adachi, Tokyo Denki University press (2009)).

By way of example, the system identification unit 181 includes a non-illustrated register configured to sequentially update and record time-series sample values of the operation amount u and the detection flow rate y of the processing liquid up to the preset past time i. Further, the system identification unit 181 determines the system parameters $a_i$ and $b_i$ based on these time-series sample values. A time-series sample number n may be determined according to, for example, a statistical method. As the time-series sample number increases, a system model having high accuracy can be constructed. The increase of the time-series sample number, however, accompanies an increase of a calculation amount at the time of determining the system parameters or an increase of the required capacity of the register. In view of this, in the system identification unit 181, a preset time-series sample number within a range of n=2~4 is used.

For example, the system identification unit 181 determines the system parameters at an interval of several tens to several hundreds of milliseconds, and outputs the result.

As depicted in FIG. 3, the system parameters determined in the system identification unit 181 are inputted to a flow rate controller 182 configured to determine an operation amount of the flow rate control valve 402.

The flow rate controller 182 of the present exemplary embodiment has functions of (1) setting an opening degree of the flow rate control valve 402 when starting a processing of the wafer W by using the system parameters acquired from the system identification unit 181, (2) adjusting a flow rate of the processing liquid for a time period during which the processing liquid is being supplied to the wafer W; and (3) estimating the flow rate of the processing liquid when detecting a malfunction of the flowmeter 403.

First, the function (1) will be elaborated.

As described above with reference to FIG. 1 and FIG. 2, in the substrate processing system 1 according to the present exemplary embodiment, wafers W are sequentially taken out of a carrier C accommodating multiple wafers W therein. The wafers W are then carried into the respective processing units 16 and processed with the processing liquid. In each processing unit 16, the processing target wafers W are held on the substrate holding mechanism 30 in turn, and the processing liquid is supplied at a target flow rate r for a preset time period such that the total supply amounts of the processing liquid supplied to the respective wafers W are same.

Figure 6:
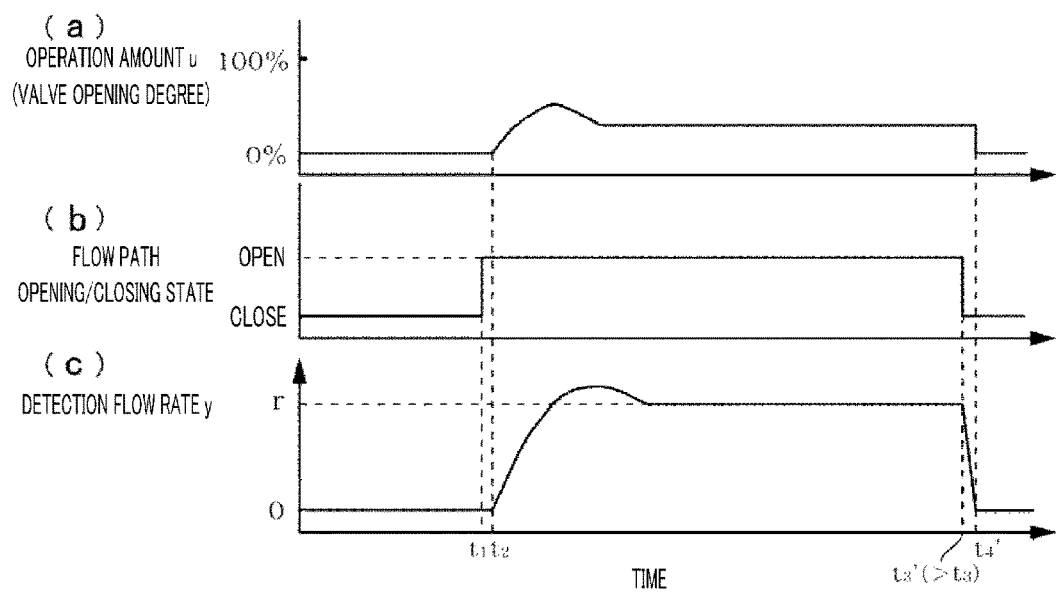
FIG. 6 is a second time chart illustrating an operation of the processing liquid supply mechanism.

If, however, the adjustment of the flow rate by the processing liquid supply unit 400 (flow rate control valve 402) is not stabilized promptly, a supply time period taken before stopping the supply of the processing liquid after starting the supply thereof is lengthened, as shown in FIG. 6 to be described later.

To resolve this problem, when starting a processing of the wafer W newly held on the substrate holding mechanism 30, the flow rate controller 182 according to the present exemplary embodiment determines an operation amount u (opening degree of the flow rate control valve 402) by using the system parameter that has been used when stopping the supply of the processing liquid onto the prior wafer W.

By way of example, for a case of n=2, the system model of the equation (1) is specifically expressed as the following equation (3).

[Expression 3]

$$x(t) - a_1 \cdot x(t-1) - a_2 \cdot x(t-2) + b_2 \cdot u(t-1) + b_2 \cdot u(t-2) \qquad (3)$$

Here, it is assumed that the processing liquid is supplied at the target flow rate r in a sufficiently stabilized state all the time. In this case, a relationship of x(t)=x(t–1)=x(t–2)=r is established. Further, if the opening degree of the flow rate control valve 402 at times t–1 and t–2 is set as a MV, the equation (3) is expressed as the following equation (4).

[Expression 4]

$$r = -a_1 \cdot r - a_2 \cdot r + b_1 \cdot MV + b_2 \cdot MV \qquad (4)$$

The following equation (5) is a result of expressing the above equation (4) for the MV.

[Expression 5]

$$MV = \frac{r \cdot (1 + a_1 + a_2)}{b_1 + b_2} \quad (5)$$

Here, since the 'MV' is the operation amount u of the opening degree of the flow rate control valve 402 when the flow rate of the processing liquid is stabilized to the target flow rate r, if this operation amount is set when starting a processing of the next wafer W, it is possible to increase the flow rate of the processing liquid from zero to the target flow rate r smoothly.

In an actual device, it takes a certain amount of time period until the flow rate of the processing liquid starts to increase from a zero level because there is a delay by transmission of an operation signal, response of the device, pressure propagation in the processing liquid, etc. However, after opening the flow rate control valve 402 in advance as much as the operation amount, by starting the supply of the processing liquid in this state, it is possible to shorten the time period taken before the flow rate of the processing liquid reaches the target flow rate r.

Based on the above-description, the flow rate controller 182 is equipped with the register configured to record the system parameter acquired from the system identification unit 181. Further, the flow rate controller 182 determines an operation amount u (opening degree $MV_{ini}$ of the flow rate control valve 402), which is required when starting a processing of a next wafer W, based on the following equation (5)' by using the system parameters acquired when finishing the processing of the prior wafer W.

[Expression 6]

$$MV_{ini} = \frac{r \cdot (1 + a_1 + a_2)}{b_1 + b_2} \quad (5)'$$

Further, the case described by using the equations (3) to (5) are a case for explaining a method of obtaining the $MV_{ini}$. Further, if there is no great change in the supply condition for the processing liquid or the device characteristic of the processing liquid supply unit 400, the system parameter hardly changes, either. Thus, actually, the system parameter recorded by the flow rate controller 182 when the processing of the prior wafer W is finished may not necessarily be determined when the processing liquid is stably flowing at the target flow rate r.

Furthermore, for example, even in a case that the target flow rate r is changed before or after a processing recipe is changed, by starting the supply of the processing liquid in the state that the flow rate control valve 402 is opened previously based on the operation amount corresponding to the target flow rate r, it is still expected to obtain an effect of shortening the time period taken before the flow rate of the processing liquid is stabilized, as compared to a case of starting the supply of the processing liquid in the state that the flow rate control valve 402 is closed.

Now, the function (2) will be described.

In the processing liquid supply device of the present exemplary embodiment, a difference value ($\Delta y(t) = r - y(t)$) between the target flow rate r of the processing liquid and the detection flow rate y detected by the flowmeter 403 is calculated in a calculation unit 183, and this difference value is inputted to the flow rate controller 182. By way of example, the flow rate controller 182 determines an operation amount based on the received difference value by a PID (Proportional-Integral-Derivative) control.

To be more specific, in the PID control, a variation width $\Delta u(t)$ of the operation amount is determined based on the following equation (6), for example, such that the difference value $\Delta y$ approaches zero.

[Expression 7]

$$\Delta u(t) = K_p \cdot \left[ \{\Delta y(t) - \Delta y(t-1)\} + \frac{\Delta t}{T_i} \cdot \Delta y(t) + \frac{T_d}{\Delta t} \cdot \{\Delta y(t) - 2 \cdot \Delta y(t-1) + \Delta y(t-2)\} \right] \quad (6)$$

(Here, $\Delta y(t) = r - y(t)$)

Here, in order to calculate a proportional gain $K_p$, an integral time $T_i$, a derivative time $T_d$ (hereinafter, these values will be altogether referred to as "control parameter" of PID control), a time constant of a primary delay of the processing liquid supply mechanism or a dead time needs to be determined.

Since the dead time or the primary delay cannot be determine from the system model represented by the aforementioned equation (1), a response relationship of the processing liquid supply mechanism is expressed again by using the following equation (7). Since the x(t-i) and the u(t-i) are constant in the state that the flow rate is in the stabilized state, the following equation (7) is obtained by expressing the equation (1) with the x(t-1) and the u(t-L).

[Expression 8]

$$x(t) = -a'_1 \cdot x(t-1) + b'_1 \cdot u(t-L) \quad (7)$$

$$\left( \text{Here, } a'_1 = \sum_{i=0}^{n} a_i, \; b'_1 = \sum_{i=0}^{n} b_i \right)$$

Here, L of the second term on the right hand side denotes the dead time. Among the $b_i$ acquired from the flow rate controller 182, i corresponding to the maximum $b_i$ is defined as the dead time L.

If the response of the processing liquid supply mechanism is expressed by the equation (7), a gain K and a time constant T of the primary delay of this system are expressed as the following equations (8) and (9).

[Expression 9]

$$T = \frac{1}{2} \cdot \frac{1 + a'_1}{1 - a'_1} \quad (8)$$

[Expression 10]

$$K = b'_1 \cdot u(2 \cdot T + 1) \quad (9)$$

According to the method described above, if the dead time L, the time constant T of the primary delay and the gain K are determined, the control parameter of the PID control can be determined by using a commonly known method such as Ziegler-Nichols method (equation (10)), ¼ attenuation method (equation (11)), or the like.

[Expression 11]

$$K_p = 1.2 \cdot \frac{T}{K*L}, T_i = 2.0 \cdot L, T_d = 0.5 \cdot L \qquad (10)$$

[Expression 12]

$$K'_p = K_p \cdot \left(1 + \frac{T_d}{T_i}\right), T'_i = T_i + T_d, T'_d = T_i \cdot \frac{T_d}{T_i + T_d} \qquad (11)$$

When finishing the control, the flow rate controller 182 determines the control parameter according to the above-described method by using the equations (7) to (11) (in case of using the equation (11), $K'_p$, $T'_i$, $T'_d$ are used instead of $K_p$, $T_i$, $T_d$ for the calculation of the equation (6)).

Furthermore, the newest control parameter is recorded in the register of the flow rate controller 182, and may be used when starting a processing of a new wafer W, for example.

Then, based on the control parameter, the operation amount u (u(t)=u(t−1)+Δu(t)) is calculated from the equation (6) to be outputted to the flow rate control valve 402. As a result, the flow rate of the processing liquid is adjusted.

Finally, the function (3) will be elaborated.

The flowmeter 403, which is configured to output the detection flow rate y to the system identification unit 181 or the calculation unit 183, may output an abnormal value due to, e.g., so-called "bubble effect" caused by bubbles contained in the processing liquid. In this case, if the PID control is performed based on this abnormal value, the processing liquid may not be supplied according to the processing recipe, so that an appropriate process may not be conducted.

Meanwhile, in the short run, it can be assumed that the estimated flow rate of the processing liquid, which is calculated based on the equation (1), is equal to the flow rate of the processing liquid discharged from the supply nozzle 41. Thus, the flow rate controller 182 monitors the detection flow rate y acquired from the flowmeter 403, and if the value of the detection flow rate y is varied beyond a preset variation range, the flow rate controller 182 stops the operation of determining the control parameter of the PID control using the detection flow rate y.

Moreover, the flow rate controller 182 also calculates, based on the equation (1), the estimated flow rate of the processing liquid by using the system parameters $a_i$ and $b_i$ acquired before (for example, immediately before) the detection flow rate y exceeds the variation range, and conducts a process of calculating the operation amount u by using the estimated flow rate (hereinafter, referred to as "exceptional process"). At this time, the flow rate controller 182 uses the system model of the equation (1) as an imaginary flowmeter.

In addition, if the state where the detection flow rate y exceeds the variation range is not continued over a preset time, the flow rate controller 182 resumes the PID control. Meanwhile, if the state where the detection flow rate y exceeds the variation range is continued over the preset time, it is highly likely that such an abnormality may be caused not by the bubble effect but by a device breakdown. Accordingly, the flow rate controller 182 stops the supply of the processing liquid and sets forth an alarm to a user through the control device 4.

The above-described system identification unit 181, the flow rate controller 182 and the calculation unit 183 may be provided within the control unit 18 of the control device 4 of the substrate processing system 1. Further, a computer for the processing liquid supply device may be provided for each of the processing units 16 or each group of the processing units 16, and this computer may be configured to have the functions of the system identification unit 181, the flow rate controller 182 and the calculation unit 183. At this time, the above-described method of adjusting the flow rate of the processing liquid may be stored, as a program, in the storage unit 19 of the control device 4 or a storage unit of the computer of the processing liquid supply device, and may be installed on the computer. Each of these storage units may be implemented by a recording medium such as a hard disc, a compact disc, a magneto-optical disc, a memory card or a flexible disc.

Now, referring to a flow chart of FIG. 4 and time charts of FIG. 5 and FIG. 6, the operation of the above-described processing liquid supply device will be explained.

Figure 5:
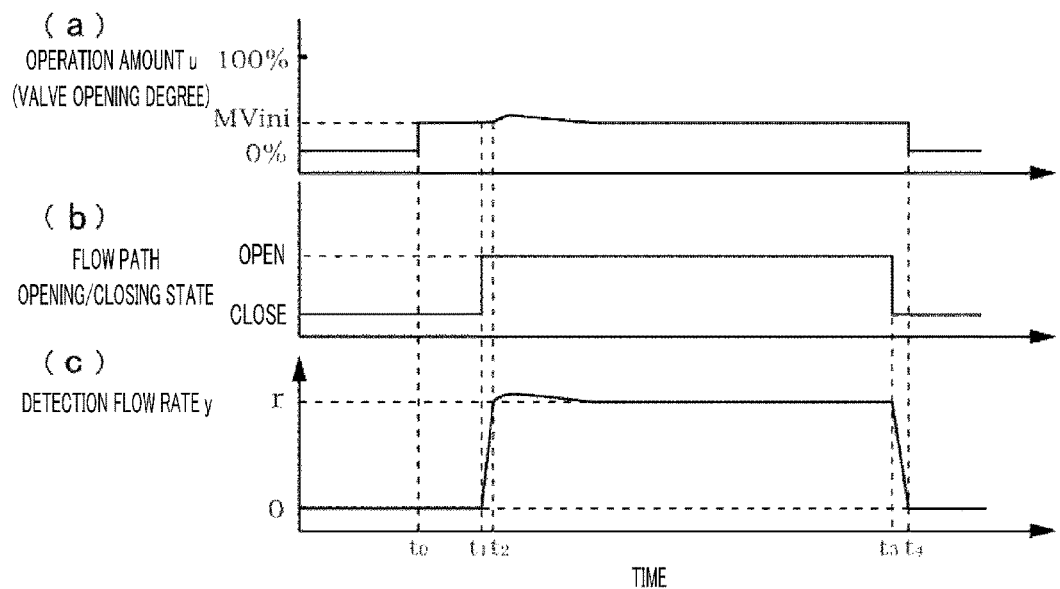
FIG. 5 is a first time chart illustrating an operation of the processing liquid supply mechanism.
Figure 7:
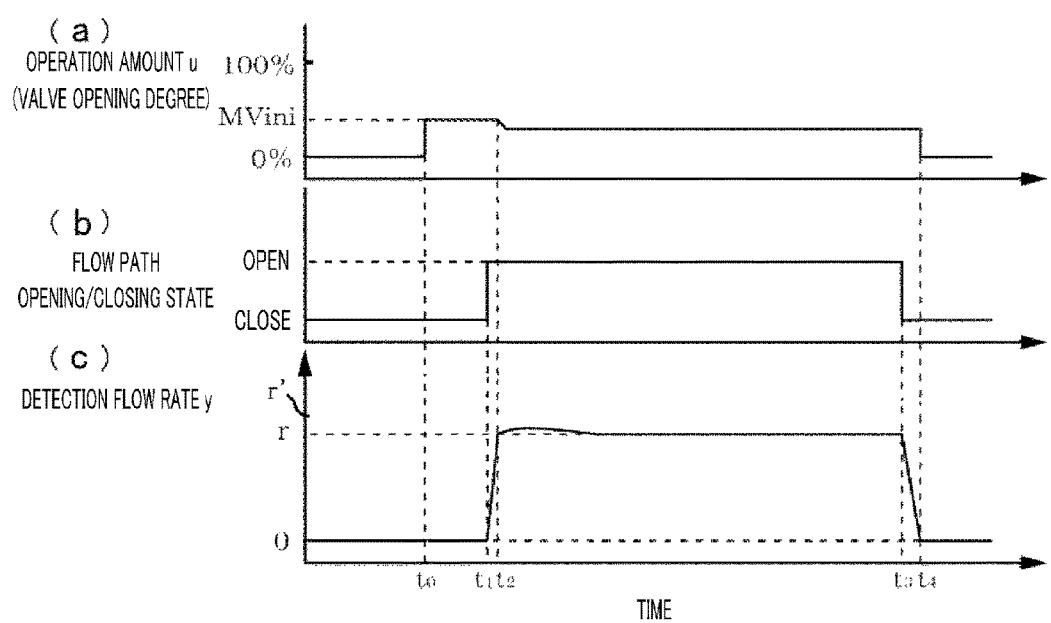
FIG. 7 is a time chart illustrating an operation of the processing liquid supply mechanism after a target flow rate r is changed.

Further, in each of the time charts of FIG. 5 to FIG. 7, an uppermost chart (a) indicates a variation of the operation amount u (opening degree of the flow rate control valve 402) outputted from the flow rate controller 182 with a lapse of time; a middle chart (b), a variation in the opening/closing state of the opening/closing valves 401 and 404 configured to supply and stop the supply of the processing liquid; and a bottommost chart (c), a variation of the detection flow rate of the flowmeter 403 with a lapse of time.

First, if a new wafer W to be processed is held on the substrate holding mechanism 30 (Start), the flow rate controller 182 reads out, from the register, the control parameter calculated when finishing the processing of a prior wafer W (process S101). Further, the flow rate controller 182 also reads out, from the register, the system parameters calculated when performing the processing of the prior wafer W (process S102).

Then, the flow rate controller 182 calculates an initial operation amount of the flow rate control valve 402 (i.e., initial opening degree $MV_{ini}$ of the flow rate control valve 402) based on the equation (5)' by using the read-out system parameters, and outputs the calculated initial operation amount to the flow rate control valve 402 (process S103). As a result, as indicated at a time point to on the chart (a) of FIG. 5, the opening degree of the flow rate control valve 402 is adjusted to $MV_{ini}$. Meanwhile, since the opening/closing valves 401 and 404 are kept closed, a supply of the processing liquid from the supply nozzle 41 to the wafer W is not begun.

Thereafter, at a time point $t_1$ when a processing of the wafer W is begun, the opening/closing valves 401 and 404 are opened, and the supply of the processing liquid is begun, as indicate by the chart (b) of FIG. 5. As a result, the processing liquid starts to flow within the processing liquid supply unit 400, and a detection flow rate of the processing liquid is outputted from the flowmeter 403 (time point $t_1$ on the chart (c) of FIG. 5). Afterwards, the detection flow rate y of the flowmeter 403 increases rapidly, and at a time point $t_2$ after a lapse of a dead time, the detection flow rate y increases near the target flow rate r. At this timing, the flow rate controller 182 starts the PID control by using the previously read-out control parameter (process S104 of FIG. 4; YES). Then, if the detection flow rate y of the flowmeter 403 is set to be normal (within the aforementioned variation range) (process S105; YES), the system identification unit 181 calculates the system parameters by using the detection flow rate y and the operation amount u acquired from the flow rate controller 182, and outputs the calculated system parameters to the flow rate controller 182 (process S106).

The flow rate controller 182 calculates the operation amount u from the equation (6) by using the control parameter read-out in the process S101, that is, the proportional gain $K_p$, the integral time $T_i$ and the derivative time $T_d$ which are determined according to the above-described method based on the equations (7) to (11). Then, the flow rate controller 182 outputs the calculated operation amount u to the flow rate control valve 402 and the system identification unit 181 (process S107). Further, the control parameter may be updated through the calculation based on the equations (7) to (11) by using the newest system parameters outputted from the system identification unit 181, and the operation amount u may be calculated based on the updated control parameter.

As a result of the above-stated operations, the opening/closing valves 401 and 404 are opened, and a flow rate control by the flow rate control valve 402 is begun at a time point $t_2$ after the lapse of the dead time. At this time, since the initial operation amount is previously obtained and the opening degree of the flow rate control valve 402 is adjusted to $MV_{ini}$ in advance, the processing liquid flows at a flow rate close to the target flow rate r immediately after the opening/closing valves 401 and 404 are opened. Since the flow rate controller 182 adjusts, under the PID control, the flow rate of the processing liquid whose flow rate is close to the target flow rate r, it is possible to allow the detection flow rate to be near the target flow rate r in a relatively short time period.

In contrast, FIG. 6 depicts time charts for a case where the initial adjustment of the opening degree of the flow rate control valve 402 is not performed. In this case, since the flow rate control valve 402 is still closed even after the opening/closing valves 401 and 404 are opened, the processing liquid does not flow immediately (no detection flow rate y is outputted). At a time point $t_2$ after a lapse of a dead time, the flow rate control valve 402 starts to be opened slowly under the PID control, and the flow rate adjustment is performed to allow the flow rate of the processing liquid to approach the target flow rate r.

In case of performing the flow rate adjustment while the flow rate control valve 402 is still closed, however, there is a large difference between the target flow rate r and the flow rate detected at the moment when the processing liquid starts to flow. Thus, it takes a certain time period until the flow rate of the processing liquid is stabilized. If it is attempted to reduce the time period, an overshoot range, in which the detection flow rate y exceeds the target flow rate r temporarily during the flow rate adjustment, may be easily increased. For this reason, as compared to the case of FIG. 5 where the initial adjustment of the opening degree of the flow rate control valve 402 is performed, it takes a longer time period until the detection flow rate is stabilized near the target flow rate r.

As a consequence, a supply time period required to supply a preset amount (sum) of processing liquid to the wafer W is lengthened, so that the processing time on the wafer W is also lengthened.

However, even in the example of FIG. 6 where the initial adjustment of the opening degree is not performed, by determining the control parameter based on the system parameters determined in the system identification unit 181 and by setting the operation amount u based on the control parameter, there can be still obtained the effect that the flow rate adjustment is performed based on the variation in the supply state of the processing liquid, the variation in the characteristic of the device constituting the processing liquid supply unit 400, etc.

Referring back to FIG. 4, the processing liquid supply device repeats the above-described operation cycle (process S104; YES to process S107) at an interval of several tens or several hundreds of milliseconds.

At this time, if the detection flow rate y of the flowmeter 403 is found to be an abnormal value exceeding the variation range (process S105; NO), the system parameters determined with the abnormal value is not used, and the exceptional process is performed (process S108). In the exceptional process, the supply of the processing liquid is continued by calculating the estimated flow rate with the previously acquired system parameters to determine the control parameter.

Further, if the operation cycle (process S104; YES to process S107) is repeated and the processing liquid is supplied for a preset time in the state that the detection flow rate y of the flowmeter 403 is in a normal state (including the case where the exceptional process is performed and the process returns back to the normal state within a preset time), the supply of the processing liquid is stopped, and the control operation is stopped (process S104; NO, normal stop). Further, even in a case that the state of performing the exceptional process is continued over a predetermined time, the control operation is stopped by stopping the supply of the processing liquid, and an alarm is set forth (process S104; NO, abnormal stop).

As a result, the opening/closing valves 401 and 404 are closed (at a time point $t_3$ of FIG. 5 and a time point $t'_3$ of FIG. 6), and the target flow rate is set to be zero. Then, the flow rate control valve 402 is also closed (at a time point $t_4$ of FIG. 5 and a time point $t'_4$ of FIG. 6).

Figure 4:
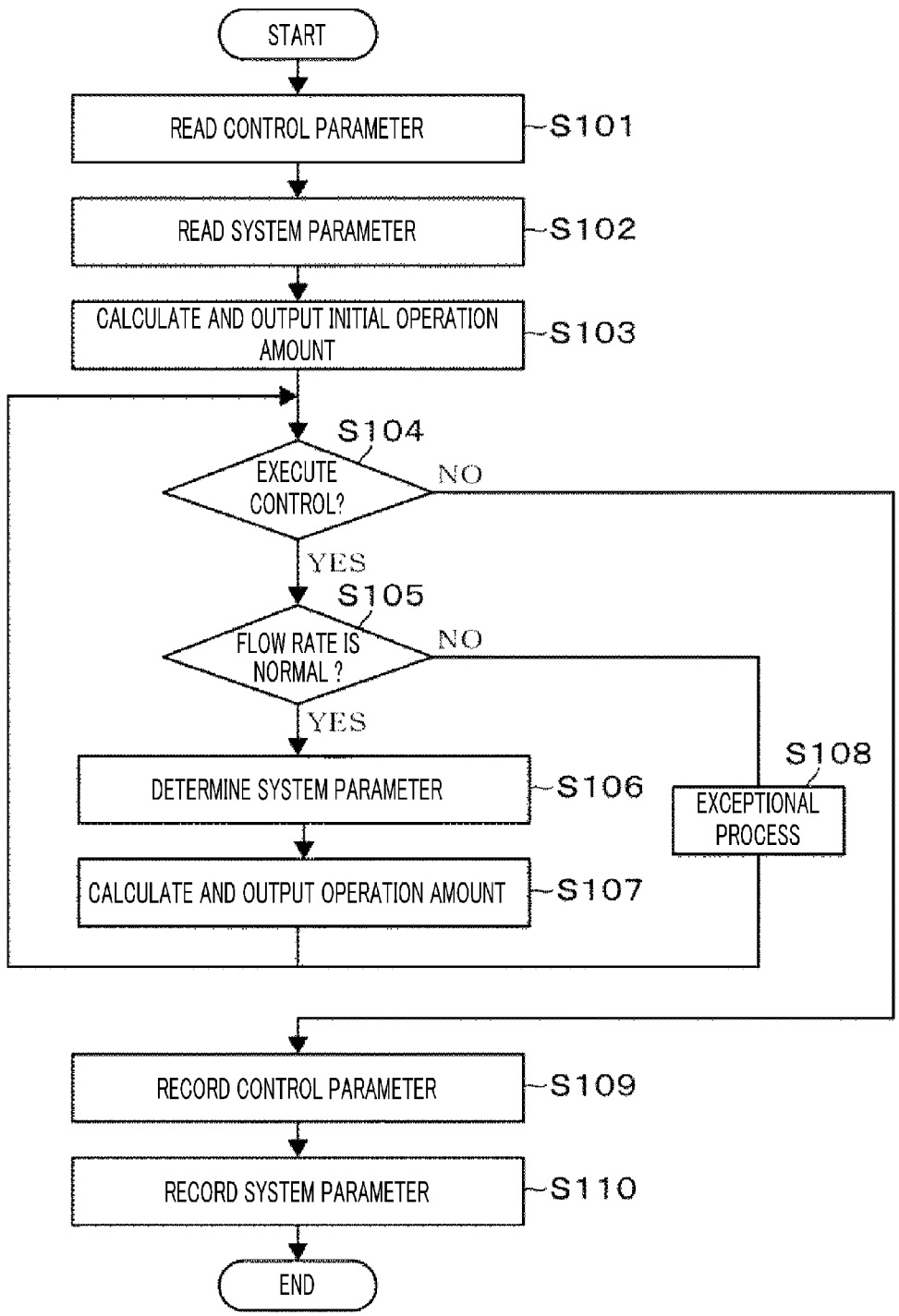
FIG. 4 is a flowchart showing a sequence of a process of supplying a processing liquid to a wafer.

Then, the control parameter, which are calculated by using the last system parameters determined in the state where the detection flow rate y is normal, are recorded in the register of the flow rate controller 182 (process S109 of FIG. 4). The finally obtained system parameters are also recorded in the register of the flow rate controller 182 (process S110), and the supply of the processing liquid to the wafer W is ended (End).

By using the processing liquid supply apparatus according to the above-described exemplary embodiment, the following effects can be achieved. When supplying the processing liquid to the wafer W by using the flow rate control valve 402 whose operation (opening degree of the valve body) is adjusted based on the operation amount u, influences of the kind of the processing liquid, the supply condition of the processing liquid or the characteristic of the device such as the flow rate control valve 402 are investigated by the system model, and the operation amount u is determined based on the investigation result. Therefore, even if the kind of the processing liquid, the supply condition of the processing liquid or the characteristic of the device is changed, it is possible to conduct the appropriate flow rate adjustment automatically while still supplying the processing liquid without manual intervention by a user.

Here, the method of determining, when starting the processing of the current wafer W, the operation amount u (opening degree $MV_{ini}$ of the flow rate control valve 402) by using the system parameters acquired when the processing of the prior wafer W is ended may also be applicable to a case where the target flow rate is changed in between the prior processing and the current processing. By way of example, FIG. 7 shows an example where the prior target flow rate r' and the current target flow rate r (<r') are different. As compared to the case where the flow rate adjustment is begun from the state where the flow rate control valve 402 is closed, if the variation range of the opening degree of the flow rate control valve 402 is small, it is possible to stabilize the flow rate of the processing liquid at an early stage, as compared to the case where the initial adjustment of the opening degree is not performed (FIG. 6).

Figure 8:
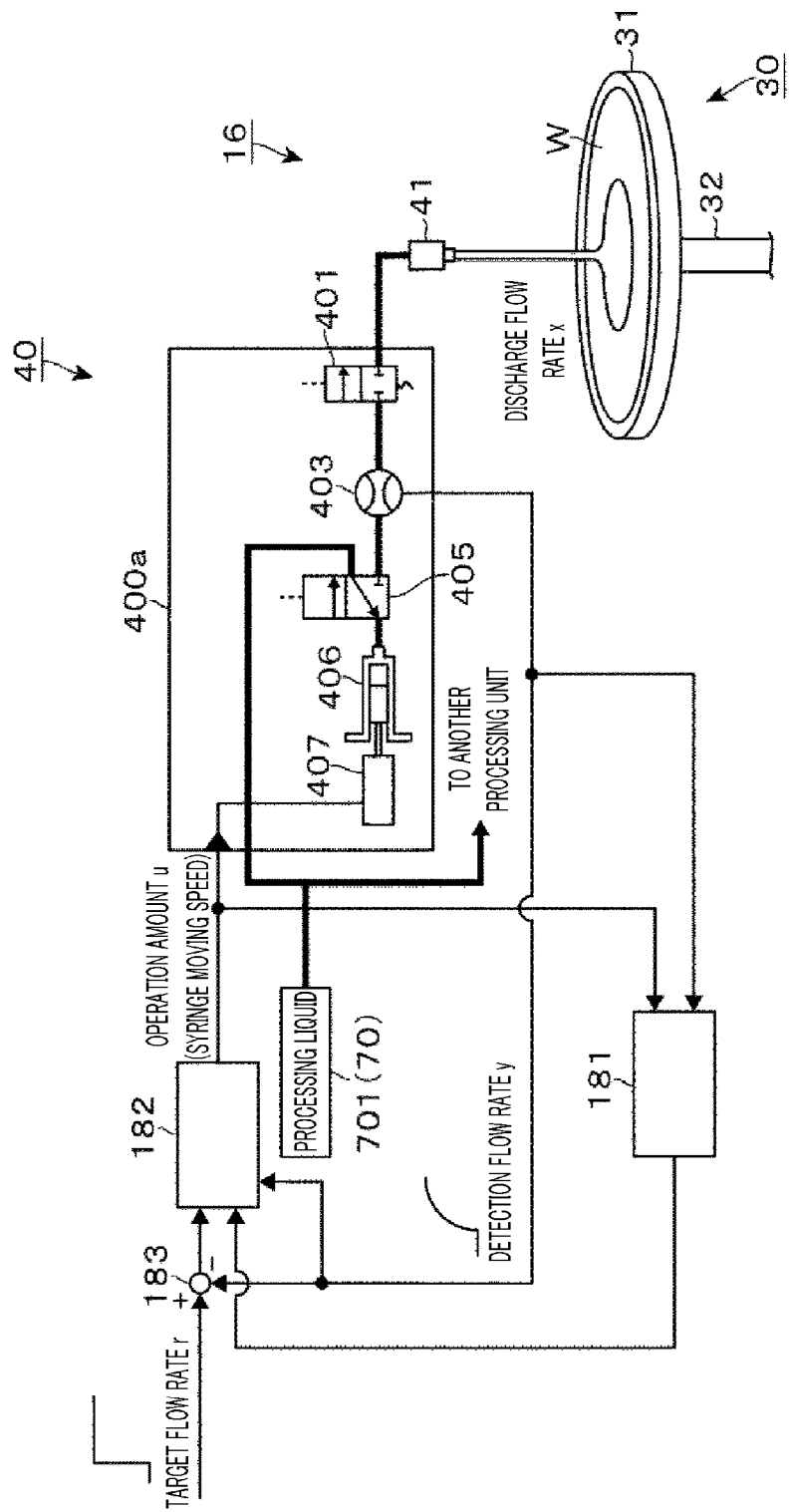
FIG. 8 is an explanatory diagram illustrating another exemplary embodiment of the processing liquid supply mechanism.

Moreover, the flow rate control mechanism configured to adjust the flow rate of the processing liquid is not limited to a configuration composed of the flow rate control valve 402. FIG. 8 illustrates an example of a processing liquid supply device implemented by a syringe pump 406 as the flow rate control mechanism provided within the processing liquid supply unit 400*a*. The syringe pump 406 is connected to the processing liquid source 701 by switching a flow path of a three-way valve 405, and is charged with the processing liquid by pulling a syringe therein. The flow path of the three-way valve 405 is switched to the supply nozzle 41, and the processing liquid is discharged from the supply nozzle 41 by being pushed out by the syringe.

In this example, a moving speed of the syringe within the syringe pump 406 corresponds to the operation amount u for the flow rate adjustment of the processing liquid.

Now, examples of the processing liquid supplied by the processing liquid supply device will be stated. In the example of the substrate processing system 1 shown in FIG. 1 and FIG. 2, various kinds of chemical liquids such as SC1 (mixed aqueous solution of ammonia and hydrogen peroxide) for removing an organic contaminant or particle, SC2 (mixed solution of hydrochloric acid, hydrogen peroxide and pure water) for removing a metal contaminant and DHF (Diluted Hydrofluoric acid) for removing a natural oxide on a surface of a metal member, and a rinse liquid such as DIW (Deionized Water) for rinsing away a chemical liquid supplied to the wafer W may be used as the processing liquid.

In addition, the processing unit 16 shown in FIG. 2 may also be applicable to a device configured to supply various kinds of coating liquids for forming, on a surface of the wafer W, a coating film such as a resist film or an antireflection film for exposure thereof, a developing liquid for developing the exposed resist film, or a liquid adhesive for sticking the wafer to a target object (for example, a substrate).

The substrate onto which the processing liquid is supplied by using the processing liquid supply device of the exemplary embodiment may not be limited to the semiconductor wafer, but may be a glass substrate such as a FPD (Flat Panel Display) or the like.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting.

I claim:

1. A processing liquid supply device of supplying a processing liquid to a target substrate held on a substrate holder, the processing liquid supply device comprising:
    a processing liquid supply mechanism including a flow rate control mechanism configured to be controlled based on an operation amount to adjust a flow rate of the processing liquid supplied from a processing liquid source, which stores the processing liquid therein, and a supply nozzle configured to discharge the processing liquid whose flow rate is adjusted by the flow rate control mechanism toward the substrate held on the substrate holder;
    a flow rate detection unit configured to detect the flow rate of the processing liquid supplied to the supply nozzle;
    a system identification unit configured to determine a system parameter based on a sum of product values obtained by multiplying the system parameter to each of a time-series sample value of the operation amount and a time-series sample value of the flow rate detected by the flow rate detection unit, in order to identify a system model for acquiring an estimated flow rate of the processing liquid discharged from the supply nozzle; and
    a flow rate controller configured to determine the operation amount by using the system parameter determined by the system identification unit and output the determined operation amount to the flow rate control mechanism,
    wherein the flow rate control mechanism is a flow rate control valve configured to increase or decrease the flow rate of the processing liquid according to an opening degree of a valve body, and
    the flow rate controller determines the operation amount, which is the opening degree of the valve body, based on a target flow rate of the processing liquid discharged from the supply nozzle and the system parameter determined by the system identification unit.

2. The processing liquid supply device of claim 1, wherein a next substrate is held on the substrate holder in turn, and
    when starting a supply of the processing liquid to the next substrate that is held on the substrate holder and replaced with the substrate, the flow rate controller determines the operation amount based on the system parameter determined when stopping the supply of the processing liquid to the substrate.

3. The processing liquid supply device of claim 1, wherein the flow rate controller determines the operation amount by a PID control based on a difference value between a target flow rate of the processing liquid discharged from the supply nozzle and the flow rate of the processing liquid detected by the flow rate detection unit, and determines a control parameter of the PID control by using the system parameter determined by the system identification unit.

4. The processing liquid supply device of claim 3, wherein if the flow rate of the processing liquid detected by the flow rate detection unit is varied beyond a preset variation range, the flow rate controller calculates the difference value based on the estimated flow rate, instead of the flow rate, obtained by using the system parameter determined before the variation is detected, and determines the operation amount based on the difference value.

5. A processing liquid supply method of supplying a processing liquid to a target substrate held on a substrate holder, the processing liquid supply method comprising:
    adjusting a flow rate of the processing liquid supplied from a processing liquid source, which stores the processing liquid therein, by a flow rate control mechanism configured to be controlled based on an operation amount;
    discharging the processing liquid whose flow rate is adjusted by the flow rate control mechanism toward the substrate held on the substrate holder from a supply nozzle;
    detecting the flow rate of the processing liquid supplied to the supply nozzle;
    determining a system parameter based on a sum of product values obtained by multiplying the system parameter to each of a time-series sample value of the operation amount and a time-series sample value of the detected flow rate, in order to identify a system model for acquiring an estimated flow rate of the processing liquid discharged from the supply nozzle; and determining the operation amount by using the system parameter determined in the determining of the system parameter, and outputting the determined operation amount to the flow rate control mechanism, wherein the flow rate control mechanism is a flow rate control valve configured to increase or decrease the flow rate of the processing liquid according to an opening degree of a valve body, and in the determining of the operation amount, the operation amount, which is the opening degree of the valve body, is determined based on a target flow rate of the processing liquid discharged from the supply nozzle and the system parameter determined in the determining of the system parameter.

6. The processing liquid supply method of claim 5, wherein a next substrate is held on the substrate holder in turn, and in the determining of the operation amount, when starting a supply of the processing liquid to the next substrate that is held on the substrate holder and replaced with the substrate, the operation amount is determined based on the system parameter determined when stopping the supply of the processing liquid to the substrate.

7. The processing liquid supply method of claim 5, wherein, in the determining of the operation amount, the operation amount is determined by a PID control based on a difference value between a target flow rate of the processing liquid discharged from the supply nozzle and the detected flow rate of the processing liquid, and a control parameter of the PID control is determined by using the system parameter determined in the determining of the system parameter.

8. The processing liquid supply method of claim 7, wherein, in the determining of the operation amount, if the detected flow rate of the processing liquid is varied beyond a preset variation range, the difference value is calculated based on the estimated flow rate, instead of the flow rate, obtained before the variation is detected, and the control parameter is determined based on the difference value.

9. A non-transitory computer-readable storage medium having stored thereon computer-executable instructions performed in a processing liquid supply device configured to supply a processing liquid to a target substrate held on a substrate holder, wherein the computer-executable instructions include processes to perform a processing liquid supply method as claimed in claim 5.

* * * * *

UNITED STATES PATENT AND TRADEMARK OFFICE
CERTIFICATE OF CORRECTION

PATENT NO. : 10,120,394 B2
APPLICATION NO. : 15/046627
DATED : November 6, 2018
INVENTOR(S) : Tsuyoshi Nogami Page 1 of 1

It is certified that error appears in the above-identified patent and that said Letters Patent is hereby corrected as shown below:

In the Specification

Column 6, Lines 55-56, "(i = 1 n)." should be -- (i = 1 ~ n). --.

Column 8, Line 47, [Expression 3], "x(t)-$a_1$·x(t-1)-$a_2$·x(t-2)+$b_2$·u(t-1)+$b_2$·u(t-2)" should be -- x(t) = -$a_1$·x(t-1) - $a_2$·x(t-2) + $b_1$·u(t-1) + $b_2$·u(t-2) --.

Column 12, Line 40, "time point to" should be -- time point $t_0$ --.

Signed and Sealed this
Nineteenth Day of March, 2019

Andrei Iancu
*Director of the United States Patent and Trademark Office*